(12) United States Patent
Ikeda

(10) Patent No.: US 6,898,115 B2
(45) Date of Patent: May 24, 2005

(54) MAGNETORESISTIVE ELEMENT, AND MAGNETIC MEMORY USING THE SAME

(75) Inventor: Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 09/973,057

(22) Filed: Oct. 10, 2001

(65) Prior Publication Data

US 2002/0044479 A1 Apr. 18, 2002

(30) Foreign Application Priority Data

Oct. 13, 2000 (JP) .................................. 2000-313566

(51) Int. Cl.$^7$ .............................................. G11C 11/14
(52) U.S. Cl. ...................... 365/171; 365/173; 365/180; 365/158
(58) Field of Search ............................. 365/171, 173, 365/180, 158

(56) References Cited

U.S. PATENT DOCUMENTS

| | | | |
|---|---|---|---|
| 5,801,984 A | 9/1998 | Parkin | 365/158 |
| 5,966,323 A * | 10/1999 | Chen et al. | 365/158 |
| 6,022,633 A * | 2/2000 | Hayashi et al. | 324/252 |
| 6,219,275 B1 | 4/2001 | Nishimura | 365/173 |
| 6,329,078 B1 | 12/2001 | Tsuge | 428/678 |
| 6,456,467 B1 * | 9/2002 | Mao et al. | 360/319 |

OTHER PUBLICATIONS

Patent Abstracts of Japan, for JPLAO 11-13587, published May 21, 1999.

* cited by examiner

Primary Examiner—VanThu Nguyen
(74) Attorney, Agent, or Firm—Fitzpatrick, Cella, Harper & Scinto

(57) ABSTRACT

A magnetoresistive film has at least a first magnetic layer, a second magnetic layer, a nonmagnetic layer, a third magnetic layer, and a fourth magnetic layer stacked in the order named. In the magnetoresistive film, at least the first magnetic layer contains Gd and the fourth magnetic layer contains Tb and/or Dy, each of the first magnetic layer and fourth magnetic layer has an easy axis of magnetization along a perpendicular direction to a film plane, and the second magnetic layer and the third magnetic layer have a greater spin polarization than the first magnetic layer and the fourth magnetic layer. Furthermore, the second and third magnetic layers are magnetic layers containing at least Co and Co contents thereof are not less than 20 at. % nor more than 90 at. %.

11 Claims, 10 Drawing Sheets

MAGNETORESISTIVE ELEMENT, AND MAGNETIC MEMORY USING THE SAME

BACKGROUND OF THE INVENTION

1. Field of the Invention

The present invention relates to a magnetoresistive film utilizing the magnetoresistance effect, and a magnetic memory using the same. Particularly, the invention concerns a magnetoresistive element and a magnetic memory in which magnetic layers are comprised of perpendicularly magnetized films.

2. Related Background Art

The magnetoresistive films are now used in reproducing heads of hard disk drives and are indispensable to hard disks of high recording density. The fundamental layout of the magnetoresistive films is the sandwich structure in which magnetic layers are contiguously formed through a nonmagnetic layer. In the magnetoresistive film used in the reproducing heads, directions of magnetization are fixed in one magnetic layer. For this reason, it is common practice to let an antiferromagnetic layer exchange-coupled with the magnetic layer for fixing the directions of magnetization and fix the magnetization directions of the magnetic layer along the uniaxial anisotropy of the antiferromagnetic layer. The magnetoresistive film of this film structure is called a spin valve film. A direction of magnetization in the other magnetic layer is reversed in accordance with a direction of a stray field from the hard disk and information recorded in the hard disk is detected based on change in electric resistance of the magnetoresistive film at this time.

Further, research is under way to apply the magnetoresistive film to solid state memories.

In recent years, semiconductor memories being the solid state memories are frequently used in information equipment and there are a variety of types of the semiconductor memories including DRAMs, FeRAMs, flash EEPROMs, and so on. These semiconductor memories have both merits and demerits of characteristics and there exists no memory satisfying all the specifications required in the current information equipment. For example, the DRAM permits high recording density and many rewriting operations, but is volatile and thus loses information without supply of power. The flash EEPROM is nonvolatile, but takes a long time for erasing and is thus not suitable for fast processing of information.

Under the present circumstances of the semiconductor memories as described above, memories making use of the magnetoresistance effect (Magnetic Random Access Memories: MRAMs) are promising as memories satisfying the specifications required in many information devices, including the recording time, reading time, recording density, the number of rewriting operations permitted, power consumption, and so on. The magnetoresistive films are constructed in the structure in which a nonmagnetic film is interposed between magnetic films. Materials often used for the nonmagnetic film are Cu and $Al_2O_3$. The magnetoresistive films using a conductor of Cu or the like as the nonmagnetic film are called giant magnetoresistive (GMR) films, and those using an insulator of $Al_2O_3$ or the like as the nonmagnetic film are called spin-dependent tunneling magnetoresistive (TMR) films. The TMR films exhibit the greater magnetoresistance effect and are thus advantageous in increase in recording density or in fast readout, and the feasibility thereof as MRAMs is justified in recent research reports.

The electric resistance of the magnetoresistive film is relatively small in a parallel state of magnetization directions in magnetic layers 41 and 42, as shown in FIG. 1A, but the electric resistance is relatively large in an antiparallel state of magnetization directions, as shown in FIG. 1B.

As the device size is decreased in order to increase the recording density of MRAM, the MRAM using longitudinally magnetized films comes to encounter a problem of failure in retaining information, because of influence of a demagnetizing field or influence of curling of magnetization at end faces. This problem can be avoided, for example, by a method of making the magnetic layers in the rectangular shape, but this method does not allow the device size to be decreased to small size, so that little increase can be expected in recording density. There were thus proposals to avoid the above problem through use of perpendicularly magnetized films, for example, as described in U.S. Pat. No. 6,219,275. Since this method does not increase the demagnetizing field even with decrease in device size, it permits the magnetoresistance films to be formed in smaller size than the MRAMs using the longitudinally magnetized films.

The magnetoresistive films using the perpendicularly magnetized films exhibit the following relations between magnetization directions and electric resistances; the electric resistance of the magnetoresistive film is relatively small in a parallel state of magnetization directions in magnetic layers 21, 25, as shown in FIG. 2A; the electric resistance is relatively large in an antiparallel state of magnetization directions, as shown in FIG. 2B.

The magnetoresistive films using the perpendicularly magnetized films are excellent in capability of reducing the device size as described above. The perpendicularly magnetized films include artificial lattice multilayer films of Pt and Co, CoCr alloys, or rare earth-transition metal alloys, etc., and it is preferable to select materials with an aspect ratio of a magnetization curve thereof close to 1, as the magnetoresistive films used in the reproducing heads and the MRAMs; the magnetic materials having such magnetic characteristics include the rare earth-transition metal alloys. These materials, however, had a problem that the rare earth metal existed at the interface to the nonmagnetic layer to impede achievement of the high magnetoresistance effect. Further, the rare earth element is extremely easy to oxidize, and there thus arose a problem that, particularly, when the nonmagnetic layer between the two magnetic layers was an oxide, the rare earth element existing at the interface became oxidized, so as to degrade the magnetic characteristics of the magnetic layers and oxygen existing in the nonmagnetic layer diffused, so as to degrade the magnetoresistance effect.

SUMMARY OF THE INVENTION

The present invention has been accomplished in view of the above problems and an object of the present invention is to provide a magnetoresistive element that permits the reduction of device size and that presents the high magnetoresistance effect.

The above object is accomplished by a magnetoresistive film in which at least a first magnetic layer, a second magnetic layer, a nonmagnetic layer, a third magnetic layer, and a fourth magnetic layer are stacked in the order named, wherein at least the first magnetic layer comprises Gd and the fourth magnetic layer comprises Tb and/or Dy, wherein each of the first magnetic layer and fourth magnetic layer has an easy axis of magnetization along a perpendicular direction to a film plane, and the second magnetic layer and the third magnetic layer have a greater spin polarization than the first magnetic layer and the fourth magnetic layer, and wherein the second and third magnetic layers are magnetic layers comprising at least Co and Co contents thereof are not less than 20 at. % nor more than 90 at. %.

The above object is also accomplished by a magnetic memory comprising: a substrate; a magnetoresistive film formed on the substrate, which comprises a first magnetic film, a second magnetic film, a nonmagnetic layer, a third magnetic film, and a fourth magnetic film, wherein the second magnetic layer and/or third magnetic layer comprises at least Co and a magnetoresistance ratio of the magnetoresistive film is not less than 10%; a write line for reversing magnetization in the magnetic films of the magnetoresistive film; and a bit line provided on the opposite side to the substrate with respect to the magnetoresistive film.

Since the above structure permits the magnetic films to be maintained as perpendicularly magnetized films, it becomes feasible to reduce the device size and provide the magnetoresistive element and the magnetic memory presenting the high magnetoresistance effect.

The details will be described in embodiments below.

DETAILED DESCRIPTION OF THE PREFERRED EMBODIMENTS

In order to achieve the great magnetoresistance effect, it is necessary to place a material with large spin polarization near the interface to the nonmagnetic layer. Materials for this purpose include Fe, Co, or CoFe alloys and the CoFe alloys are particularly preferable because of possession of large spin polarization. However, these materials demonstrate great magnetic anisotropy in the longitudinal directions within the film plane in the form of a single-layer film, and it is thus difficult to make magnetization stable in the perpendicular direction to the film plane. It is then possible to direct the direction of magnetization along the perpendicular direction in the CoFe alloy film, for example, by making it exchange-coupled with a magnetic film having the easy axis of magnetization along the perpendicular direction.

Figure 1A:
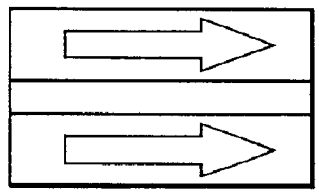
FIGS. 1A and 1B are diagrams for explaining the relations between magnetization directions and resistances of the conventional magnetoresistive film using the longitudinally magnetized films.
Figure 1B:
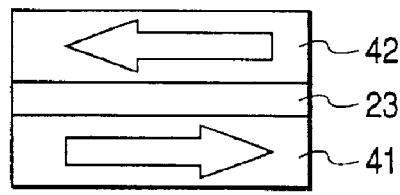
Figure 2A:
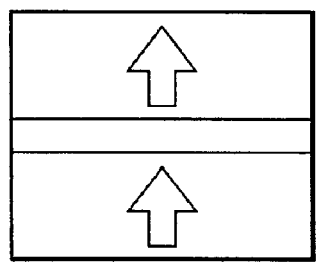
FIGS. 2A and 2B are diagrams for explaining the relations between magnetization directions and resistances of the conventional magnetoresistive film using the perpendicularly magnetized films.
Figure 2B:
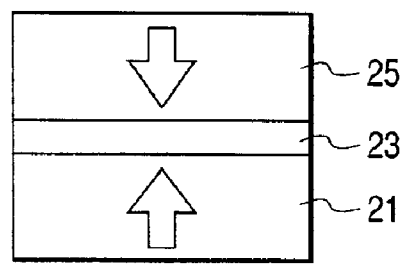
Figure 3:
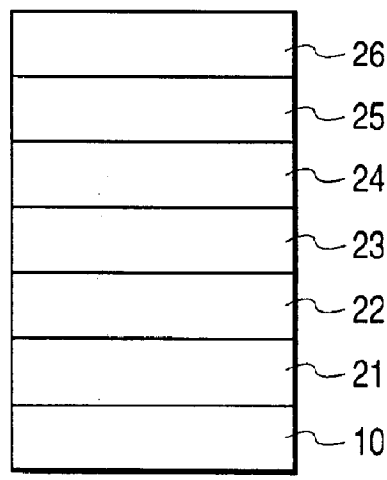
FIG. 3 is a cross-sectional view showing a film structure of a magnetoresistive film according to the present invention.

FIG. 3 shows an example of the film structure of the magnetoresistive element according to the present invention. Numeral 10 designates a substrate, 21 a first magnetic layer, 22 a second magnetic layer, 23 a nonmagnetic layer, 24 a third magnetic layer, 25 a fourth magnetic layer, and 26 a protective layer.

The substrate is, for example, an Si substrate, a glass substrate, or the like.

The first magnetic layer and the fourth magnetic layer are magnetic materials demonstrating perpendicular magnetic anisotropy, for example, perpendicularly magnetized films with the easy axis of magnetization along the perpendicular direction. The first magnetic layer is exchange-coupled with the second magnetic layer, and the fourth magnetic layer with the third magnetic layer. The magnetization in the second magnetic layer and in the third magnetic layer is directed in the perpendicular direction by exchange coupling force from the first magnetic layer and from the fourth magnetic layer, respectively. The magnetic materials used for the first magnetic layer and the fourth magnetic layer are preferably the rare earth-transition metal alloys in terms of magnetic characteristics, in which the rare earth metal is particularly preferably either Gd, Dy, or Tb. For applying the magnetoresistive film to the MRAM, it is necessary to construct the two layers on the both sides of the nonmagnetic layer so that one layer has a large coercive force or a large magnetic field for reversal of magnetization and the other layer has a small coercive force or a small magnetic field for reversal of magnetization. In that case, one magnetic layer is made of a magnetic film containing Gd so as to have a relatively small coercive force and the other magnetic layer is made of a magnetic film containing Tb and/or Dy so as to have a relatively large coercive force, thereby permitting suitable application to memory devices of the MRAM.

It is preferable to use an insulating film as the nonmagnetic layer to form the magnetoresistive element using the spin tunneling effect, because a resistance change rate is high. This insulating film is preferably an oxide like aluminum oxide, because it can be produced in an easy process and because greater magnetoresistance ratio can be provided.

Figure 4:
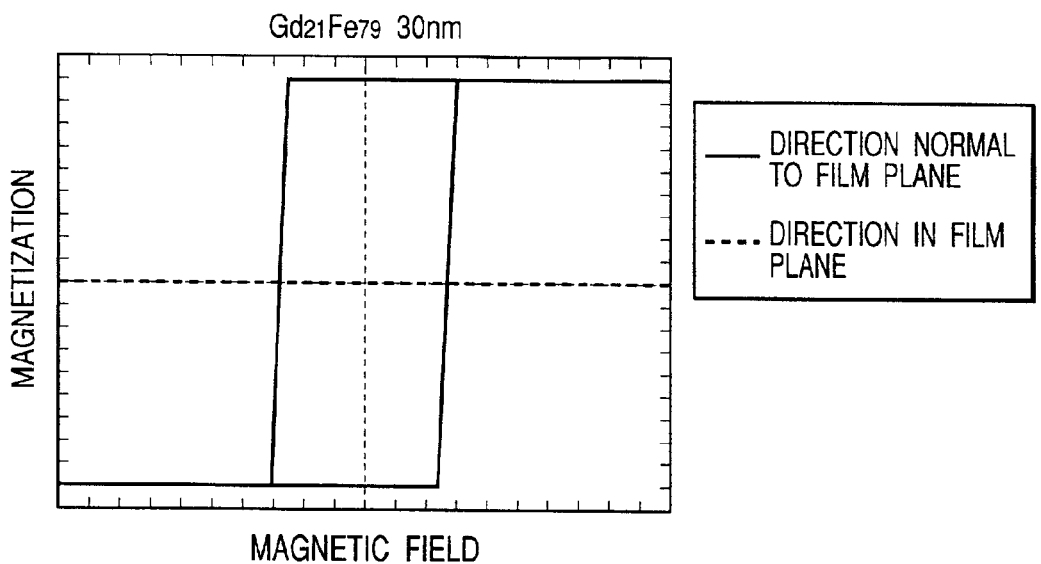
FIG. 4 is a diagram showing magnetization curves of a $Gd_{21}Fe_{79}$ perpendicularly magnetized film.
Figure 5:
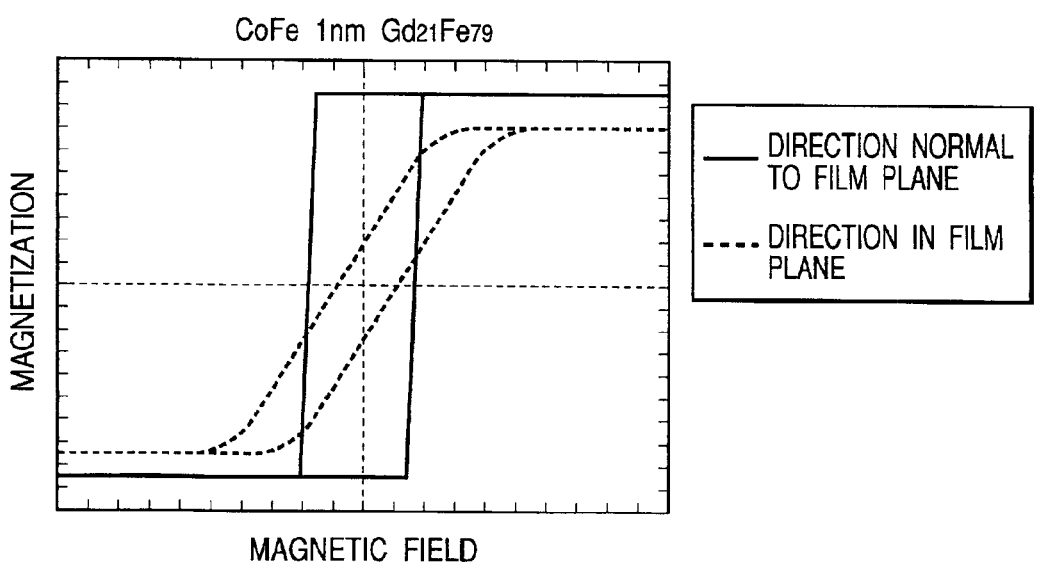
FIG. 5 is a diagram showing magnetization curves of exchange-coupled films in which a film of $Co_{50}Fe_{50}$ 1 nm thick is exchange-coupled with a perpendicularly magnetized film of $Gd_{21}Fe_{79}$.
Figure 6:
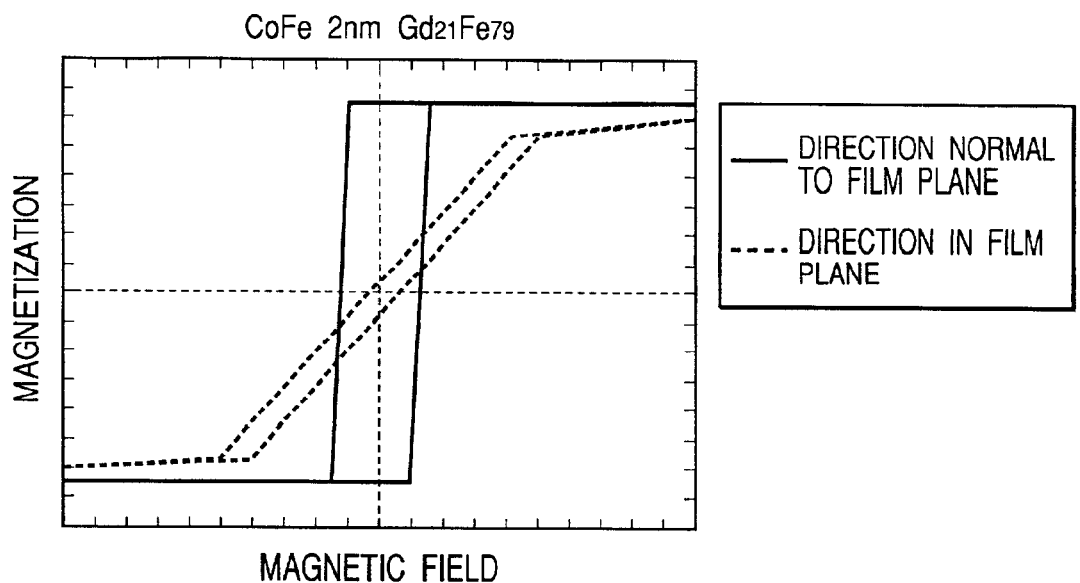
FIG. 6 is a diagram showing magnetization curves of exchange-coupled films in which a film of $Co_{50}Fe_{50}$ 2 nm thick is exchange-coupled with a perpendicularly magnetized film of $Gd_{21}Fe_{79}$.
Figure 7:
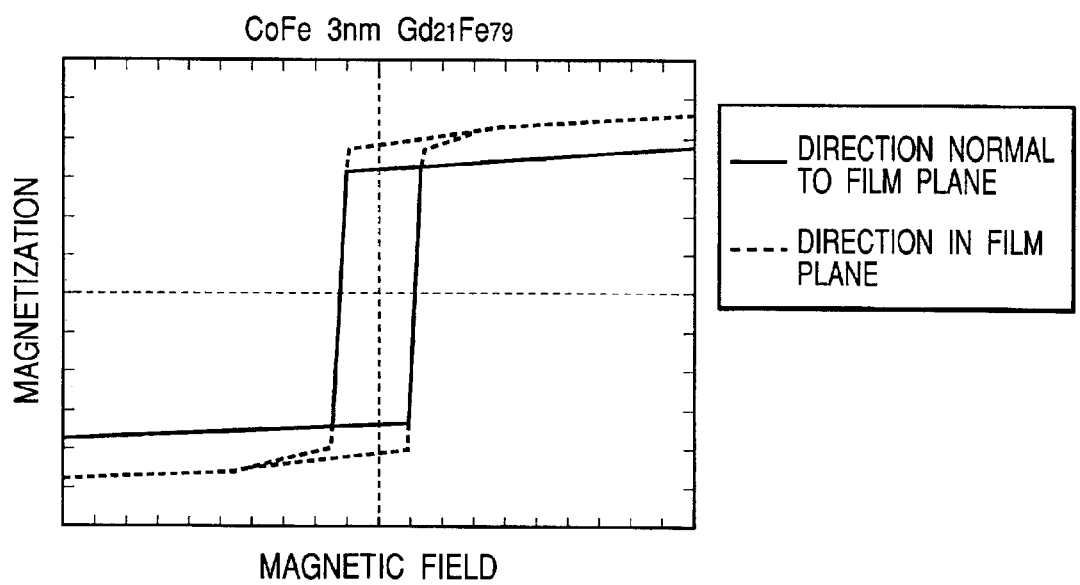
FIG. 7 is a diagram showing magnetization curves of exchange-coupled films in which a film of $Co_{50}Fe_{50}$ 3 nm thick is exchange-coupled with a perpendicularly magnetized film of $Gd_{21}Fe_{79}$.

FIG. 4 to FIG. 7 show magnetization curves measured for exchange-coupled multilayer films in which a perpendicularly magnetized film is a film of $Gd_{21}Fe_{79}$ 30 nm thick and is exchange-coupled with a $Co_{50}Fe_{50}$ alloy film and among which the film thickness of the $Co_{50}Fe_{50}$ alloy film is different. A silicon wafer with an oxidized surface was used as a substrate and a Pt film 2 nm thick was placed as an upper protective film. The magnetic field was applied in the intensity of ±0.16 MA/m to all the samples and the magnetization was measured by V.S.M with the magnetic field being applied in the longitudinal direction and in the perpendicular direction. FIG. 4 shows magnetization curves of a $Gd_{21}Fe_{79}$ single-layer film, and the magnetization curve is rectangular with the magnetic field being applied in the perpendicular direction. No change in magnetization was observed with the magnetic field being applied in the longitudinal direction. FIG. 5 shows magnetization curves of the exchange-coupled films in which the $Gd_{21}Fe_{79}$ film is exchange-coupled with the $Co_{50}Fe_{50}$ film 1 nm thick, and FIG. 6 magnetization curves of the exchange-coupled films in which the $Gd_{21}Fe_{79}$ film is exchange-coupled with the $Co_{50}Fe_{50}$ film 2 nm thick. In the both magnetization curves, change of magnetization was observed in the longitudinal direction. The rectangular magnetization curve was obtained in the perpendicular direction. FIG. 7 shows magnetization curves of the exchange-coupled films in which the $Gd_{21}Fe_{79}$ film is exchange-coupled with the $Co_{50}Fe_{50}$ film 3 nm thick. In this case, the intensity of magnetization becomes saturated by a relatively weak magnetic field in the longitudinal direction, but the magnetization is not saturated within the weak magnetic field range in the perpendicular direction. Namely, when the $Co_{50}Fe_{50}$ alloy film has the thickness of 3 nm, the magnetization in the $Co_{50}Fe_{50}$ alloy film becomes apt to be directed in the longitudinal direction and it is thus seen that it is difficult to make the magnetization of the $Co_{50}Fe_{50}$ alloy film stable in the perpendicular direction by exchange coupling with the perpendicularly magnetized film.

Figure 8:
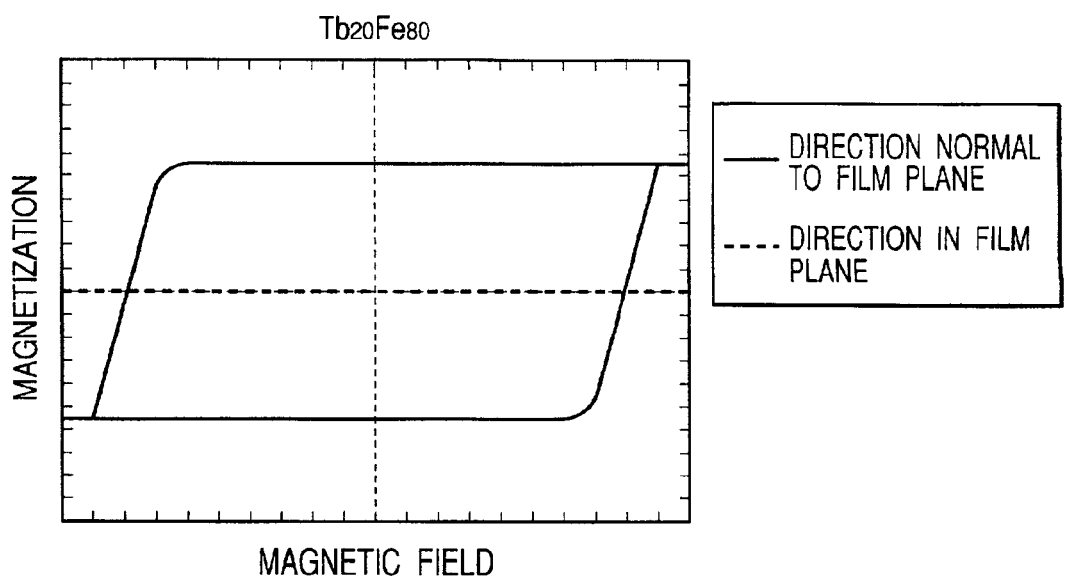
FIG. 8 is a diagram showing magnetization curves of a $Tb_{20}Fe_{80}$ perpendicularly magnetized film.
Figure 9:
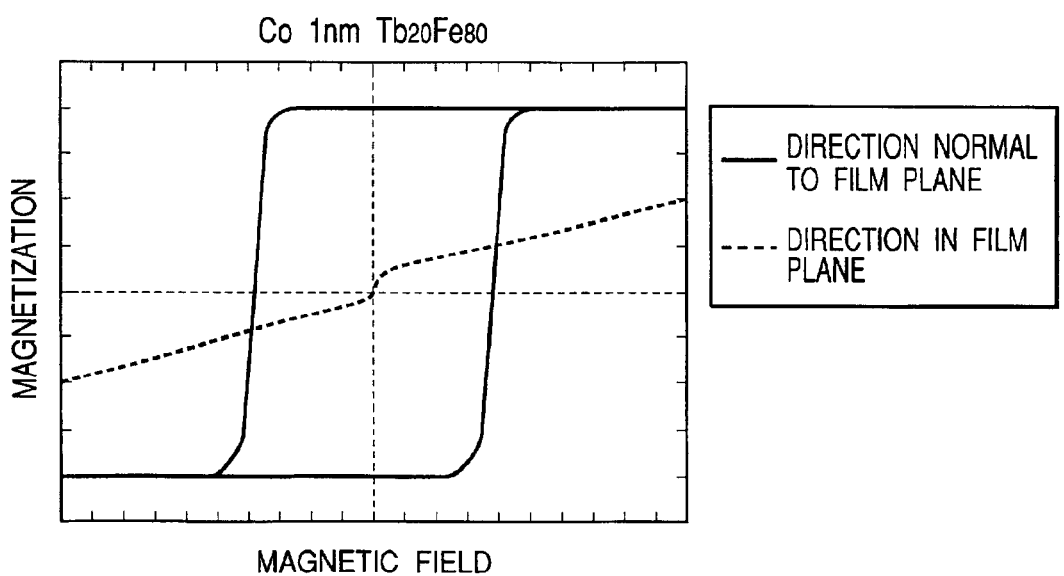
FIG. 9 is a diagram showing magnetization curves of exchange-coupled films in which a film of Co 1 nm thick is exchange-coupled with a perpendicularly magnetized film of $Tb_{20}Fe_{80}$.
Figure 10:
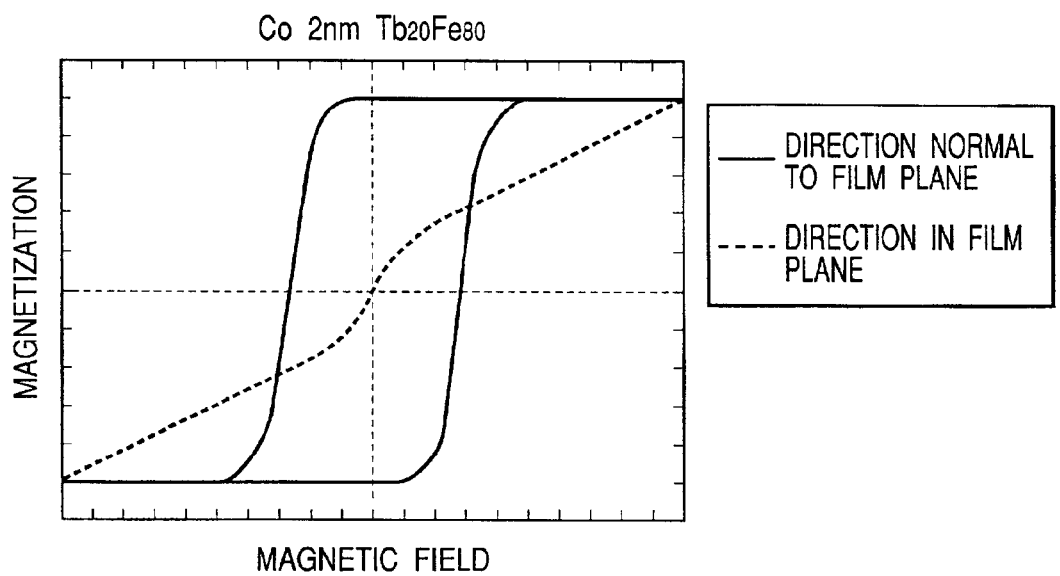
FIG. 10 is a diagram showing magnetization curves of exchange-coupled films in which a film of Co 2 nm thick is exchange-coupled with a perpendicularly magnetized film of $Tb_{20}Fe_{80}$.
Figure 11:
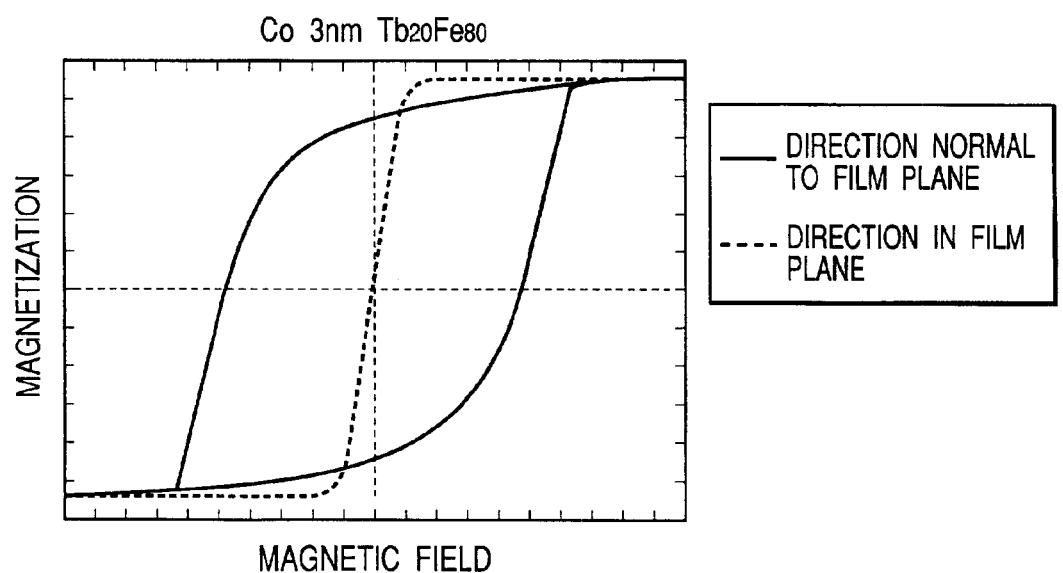
FIG. 11 is a diagram showing magnetization curves of exchange-coupled films in which a film of Co 3 nm thick is exchange-coupled with a perpendicularly magnetized film of $Tb_{20}Fe_{80}$.

FIGS. 8 to 11 show magnetization curves measured for multilayer films in which a film of $Tb_{20}Fe_{80}$ 40 nm thick is used as a perpendicularly magnetized film and is exchange-coupled with a Co film and among which the thickness of the Co film is different. FIG. 8 shows magnetization curves of a $Tb_{20}Fe_{80}$ single-layer film, and the magnetization curve obtained is close to the rectangular shape with the magnetic field being applied in the perpendicular direction. As apparent from comparison with FIG. 4, the coercive force becomes larger than that of the magnetic film containing Gd. No change in magnetization was recognized in the longitudinal direction. FIG. 9 shows magnetization curves of the exchange-coupled films in which the $Tb_{20}Fe_{80}$ film is exchange-coupled with the Co film 1 nm thick, and FIG. 10 magnetization curves of the exchange-coupled films in which the $Tb_{20}Fe_{80}$ film is exchange-coupled with the Co film 2 nm thick. In the both magnetization curves, change of magnetization was recognized in the longitudinal direction. It is also seen that in the perpendicular direction the magnitude of coercive force is lower than in the case of the $Tb_{20}Fe_{80}$ single-layer film and that at the magnetic field of zero the intensity of magnetization is saturated and magnetization is aligned in either one direction. FIG. 11 shows magnetization curves of the exchange-coupled films in which the $Tb_{20}Fe_{80}$ film is exchange-coupled with the Co film 3 nm thick. It is seen from these magnetization curves that in the perpendicular direction the intensity of magnetization is reduced at the magnetic field of zero and the magnetization is partly reversed or inclined. In other words, it is seen that the magnetization of the Co film becomes apt to be directed in the longitudinal direction when the Co film has the thickness of 3 nm and that it is thus difficult to make the magnetization of the Co film stable in the perpendicular direction even by exchange coupling with the perpendicularly magnetized film.

As described above, it is not easy to direct the magnetization of the transition metal film having the thickness of not less than 3 nm in the perpendicular direction, even in the case of the TbFe alloy film having great perpendicular magnetic anisotropy of $10^6$ to $10^7$ erg/cc.

From the above results, the thicknesses of the second magnetic layer and the third magnetic layer placed at the interfaces to the nonmagnetic layer in the magnetoresistive film are preferably not more than 2 nm. On the other hand, the thicknesses of the second magnetic layer and the third magnetic layer need to be not less than at least one atomic layer, i.e., not less than 0.2 nm.

Figure 12:
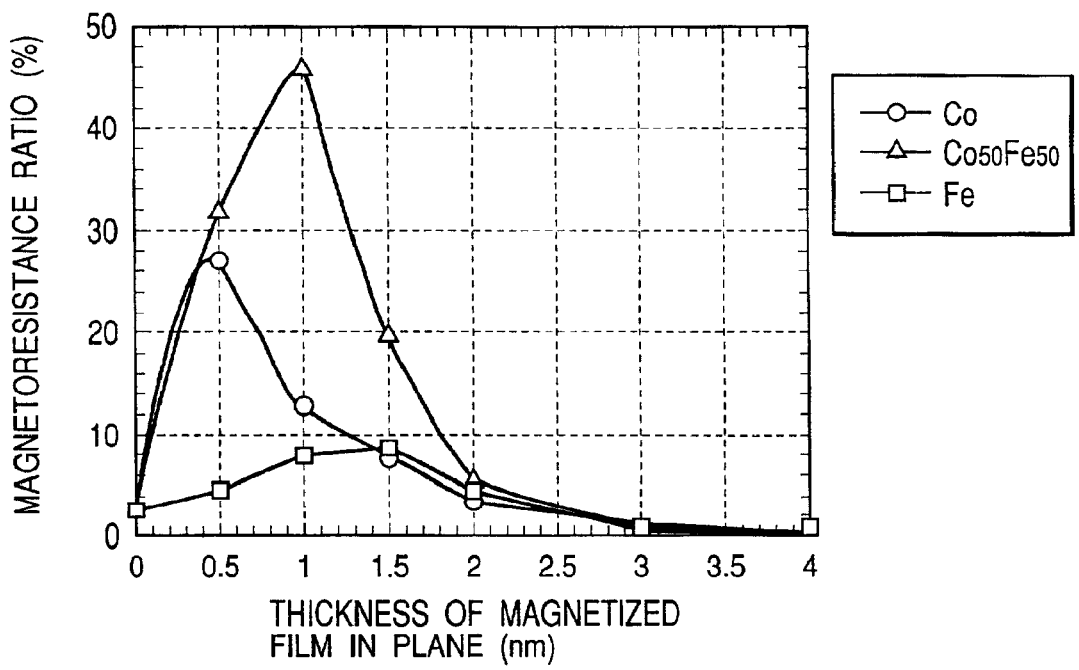
FIG. 12 is a graph showing relations between thickness and magnetoresistance ratio of longitudinally magnetized films.
Figure 13:
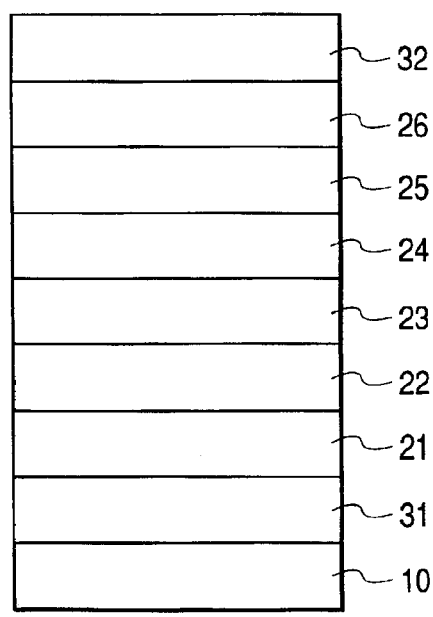
FIG. 13 is a cross-sectional view of the films used for investigation of the relations of FIG. 12.

FIG. 12 is a graph showing plots of magnetoresistance ratio of spin tunneling magnetoresistive films in the film structure shown in FIG. 13, against thicknesses of Co, $Co_{50}Fe_{50}$, and Fe films. Resistances were measured by the dc four-terminal method. An AlCu alloy film formed in the thickness of 25 nm on a silicon wafer is a lower electrode 31 for supplying an electric current to the magnetoresistive film, and an Al film formed in the thickness of 50 nm in the uppermost part is an upper electrode 32. Successively formed on the AlCu alloy film are a GdFe alloy film (first magnetic layer 21) 50 nm thick, a second magnetic layer 22, an $Al_2O_3$ film (nonmagnetic layer 23) 2.2 nm thick, a third magnetic layer 24, and a TbFe alloy film (fourth magnetic layer 25) 30 nm thick as a magnetoresistive film. The thickness of the second magnetic layer is the same as that of the third magnetic layer.

When the second and third magnetic films are not placed at the interfaces to the $Al_2O_3$ film, the magnetoresistance ratio is 3%. When the Co films are placed at the interfaces to the $Al_2O_3$ film, at the thickness of 0.5 nm the magnetoresistance ratio becomes maximum and the value thereof increases to 27%. When the second magnetic layer and the third magnetic layer are a $Co_{50}Fe_{50}$ alloy, at the film thickness of 1 nm the magnetoresistance ratio becomes maximum and the value thereof is 46%. Further, in the case of Fe, the magnetoresistance ratio becomes maximum at the film thickness of 1.5 nm. Namely, the optimal thicknesses of the second magnetic layer and the third magnetic layer differ depending upon their compositions, but the magnetoresistance ratio becomes maximum in the thickness range of 0.5 nm to 1.5 nm. Accordingly, the thicknesses of the second magnetic layer and the third magnetic layer are more preferably 0.5 nm to 1.5 nm.

Figure 14:
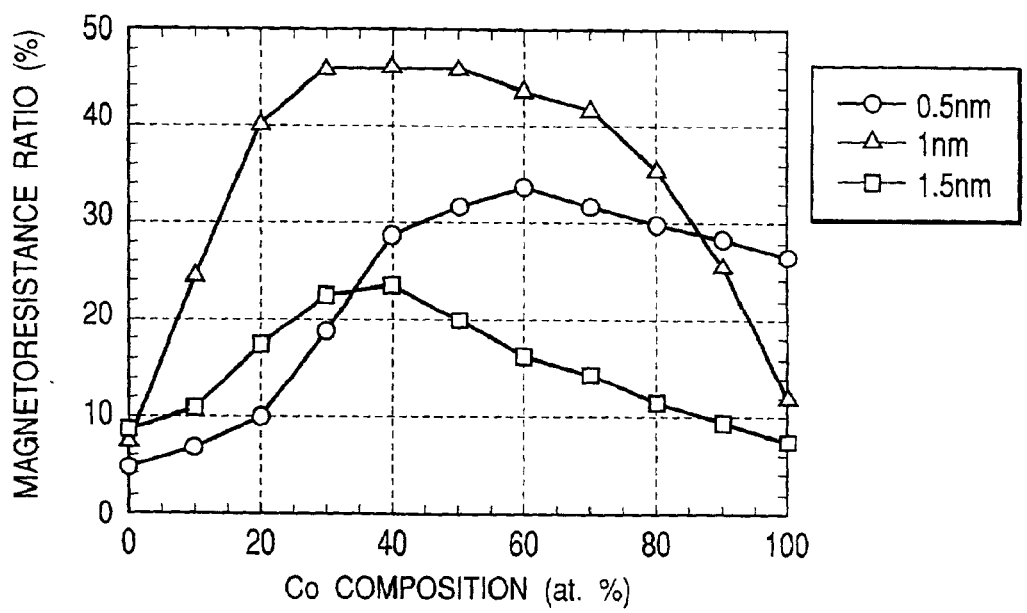
FIG. 14 is a graph showing relations between Co composition and magnetoresistance ratio.

FIG. 14 is a graph showing plots of magnetoresistance ratio against composition of CoFe alloy films. When the Co composition ratio is near 0 at. % or 100 at. %, the magnetoresistance ratio decreases steeply, but in the range of the Co composition of 20% to 90%, the magnetoresistance ratio is not less than 10% and it is thus feasible to achieve the magnetoresistance ratio preferable for use in the MRAMs, as described hereinafter. In the range of 20 at. % to 70 at. %, the magnetoresistance ratio is as high as 40% or more. Further, the magnetoresistance ratio exhibits the maximum of 46% in the range of 30 at. % to 50 at. %. Accordingly, in the CoFe alloy films used for the second magnetic layer and the third magnetic layer, the Co composition ratio may be not less than 20 at. % nor more than 90 at. %, preferably not less than 20 at. % nor more than 70 at. %, and more preferably not less than 30 at. % nor more than 50 at. %.

Figure 15:
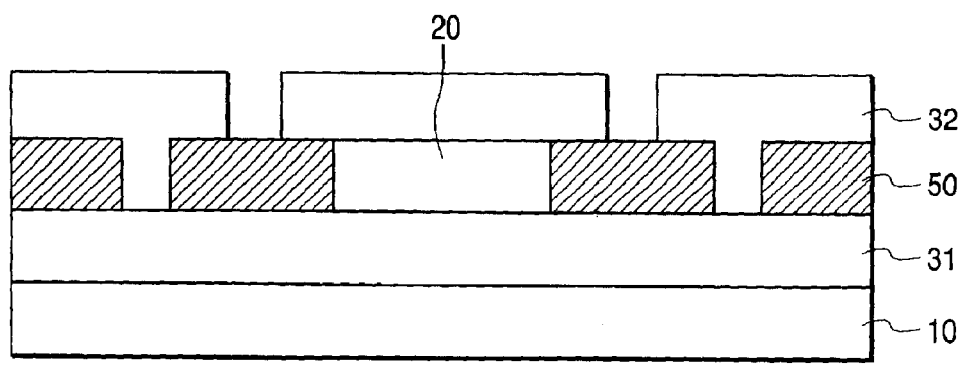
FIG. 15 is a cross-sectional view of the device used in examples and comparative examples.

Described below is the operation in an application where the magnetoresistive elements of the present invention are used as memory devices. FIG. 15 is a conceptual diagram in which the magnetoresistive film is applied to the memory devices. The substrate 10 is, for example, a semiconductor substrate or the like, and metal, e.g., such as Al, polysilicon, or the like is used for lower electrode 31 on the substrate and for upper electrode 32. The magnetoresistive element 20 is placed on the lower electrode 31 and the upper electrode 32 is laid on the magnetoresistive element 20. Insulating films 50 are provided as device isolation areas for isolating adjacent memory devices from each other.

Figure 18:
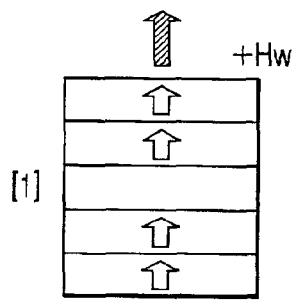
FIG. 18 is a diagram for explaining another reproduction principle in use of the magnetoresistive element of the present invention as a memory device.
Figure 19:
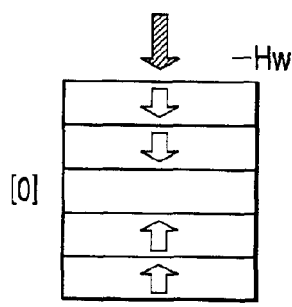
FIG. 19 is a diagram for explaining another reproduction principle in use of the magnetoresistive element of the present invention as a memory device.

Methods of detecting information recorded in the magnetoresistive elements are roughly classified under two types, an absolute detection method and a relative detection method. FIGS. 16A, 16B and 16C to FIG. 19 are drawings showing states of magnetic field applying directions and magnetization directions where the magnetoresistive element of the present invention is used as a memory device, wherein FIGS. 16A to 16C and FIGS. 17A to 17C are diagrams for explaining the relative detection method and FIG. 18 and FIG. 19 are diagrams for explaining the absolute detection method.

The relative detection method will be described first. The exchange-coupled films consisting of the first magnetic layer 21 and the second magnetic layer 22 are used as a memory layer, and the exchange-coupled films consisting of the third magnetic layer 24 and the fourth magnetic layer 25 as a detection layer. The coercive force of the memory layer is set greater than that of the detection layer. In this case, preferably, the first magnetic layer is a magnetic film containing Tb and/or Dy, and the fourth magnetic film a magnetic film containing Gd.

Figure 16A:
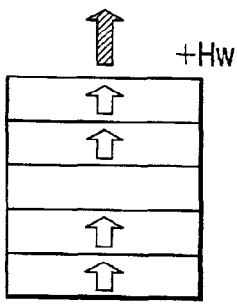
FIGS. 16A, 16B, and 16C are diagrams for explaining a reproduction principle in use of the magnetoresistive element of the present invention as a memory device.
Figure 16B:
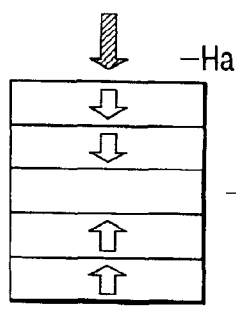
Figure 16C:
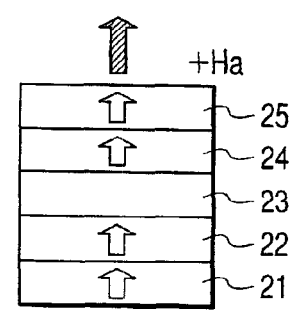
Figure 17A:
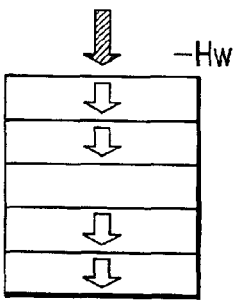
FIGS. 17A, 17B, and 17C are diagrams for explaining a reproduction principle in use of the magnetoresistive element of the present invention as a memory device.
Figure 17B:
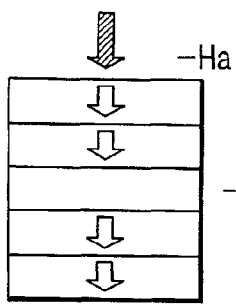
Figure 17C:
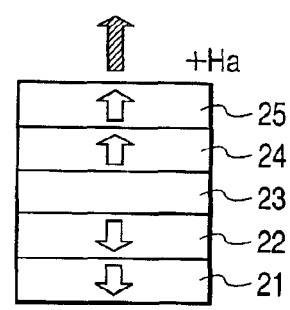

An information piece "1" is recorded in the magnetoresistive element upon application of an upward recording magnetic field +Hw, as shown in FIG. 16A, while an information piece "0" is recorded therein upon application of a downward recording magnetic field −Hw, as shown in FIG. 17A. It is, however, noted that the intensity of the recording magnetic field is greater than the coercive force of the memory layer. For detecting the recorded information, for example, a downward detection magnetic field −Ha is first applied and an upward detection magnetic field +Ha is then applied. It is, however, noted that the intensity of the detection magnetic field is smaller than the coercive force of the memory layer but greater than the coercive force of the detection layer. When the data "1" is recorded, magnetization directions in each of the layers vary first as shown in FIG. 16B and then as shown in FIG. 16C during detection. In FIG. 16B, since the magnetization direction of the memory layer is antiparallel to the magnetization direction of the detection layer, the magnetoresistive element demonstrates a large value of resistance. In FIG. 16C, the magnetization direction of the memory layer is parallel to the magnetization direction of the detection layer, and thus the magnetoresistive element exhibits a small value of resistance. Accordingly, in the state of the data "1" being recorded, the resistance varies from the high value to the low value through the detection operation. In the case of the data "0" being recorded, as shown in FIGS. 17B and 17C, the magnetization directions of the magnetoresistive element vary from parallel to antiparallel during detection. Therefore, the resistance of the magnetoresistive element varies from the small value to the large value.

Namely, the ways of variation in the resistance during the detection are different between in the recorded state of "1" and in the recorded state of "0", so that the recorded information can be determined by detecting the ways of variation in resistance. In the relative detection method, since the detection is implemented based on only the magnetoresistance ratio of each magnetoresistive element, the magnetoresistance ratio does not have to be so large and, for example, in the case of FIG. 12, the magnetoresistive element can be one wherein the magnetic films containing Co are used as intermediate layers and have the thickness of about 0.2 nm to 1.5 nm and the magnetoresistance ratio of not less than 10%.

The absolute detection method will be described next. In this case, the exchange-coupled films consisting of the first magnetic layer 21 and the second magnetic layer 22 have a very large magnetic field for reversal magnetization and serve as a magnetization fixing layer in which the magnetization direction is not reversed by the recording magnetic field. Such magnetic layers can be readily fabricated by use of the magnetic films containing Tb and/or Dy. In FIGS. 18 and 19 the magnetization direction of the magnetization fixing layer is upward. The exchange-coupled films consisting of the third magnetic layer 24 and the fourth magnetic layer 25 have the magnetization reversal magnetic field smaller than the recording magnetic field and the exchange-coupled films will be called a free layer. In recording, the information piece "1" is recorded upon application of the upward recording magnetic field, and the information piece "0" is recorded upon application of the downward recording magnetic field. During the detection, the detecting magnetic field is not applied, unlike the above relative detection method, and the resistance of the magnetoresistive element is detected without change of the magnetization direction. When the data "1" is recorded in the magnetoresistive element, the magnetization directions of the free layer and the magnetization fixing layer are parallel, as shown in FIG. 18, so that the resistance is low. When the data "0" is recorded, the magnetization directions of the free layer and the magnetization fixing layer are antiparallel, as shown in FIG. 19, so that the resistance is high. As seen from the above, the absolute detection method involves great dispersion in resistance among many devices arranged, and requires a greater magnetoresistance ratio than the relative detection method, but takes a shorter time for readout.

EXAMPLES

Example 1

The interior of a chamber was evacuated to a vacuum of not more than $1 \times 10^{-5}$ Pa and an $Al_{50}Cu_{50}$ alloy film as the lower electrode 31 was deposited in the thickness of 25 nm on a silicon wafer by magnetron DC sputtering. Then a $Gd_{21}Fe_{79}$ alloy film was deposited as the first magnetic layer 21 in the thickness of 50 nm, a $Co_{30}Fe_{70}$ alloy film as the second magnetic layer 22 in the thickness of 1 nm, and an $Al_2O_3$ film as the nonmagnetic layer 23 in the thickness of 2.2 nm. Then inverse sputtering was carried out in oxygen gas to oxidize the $Al_2O_3$ film by plasma oxidation. Further deposited thereon in order were a $Co_{30}Fe_{70}$ alloy film as the third magnetic layer 24 in the thickness of 1 nm, a $Tb_{20}Fe_{80}$ alloy film as the fourth magnetic layer 25 in the thickness of 30 nm, and a Pt film as the protective layer 26 in the thickness of 2 nm.

The magnetoresistive film obtained in the above-stated manner was coated with a resist in the thickness of about 1 μm by a spinner, and a square resist pattern of 50 μm×50 μm was formed by use of an aligner. After that, the film was removed to the surface of the $Al_{50}Cu_{50}$ alloy film by a milling machine and, subsequent thereto, a film of $Al_2O_3$ was deposited as the insulating films 50 in the thickness of 90 nm. The resultant was ultrasonic-cleaned in acetone to remove the resist and $Al_2O_3$ film deposited thereon. Two contact holes were bored in the $Al_2O_3$ film around the device obtained in this way, with a focused ion beam, and a patterned resist was again formed thereon by the aligner. Then an Al film was deposited thereon in the thickness of 50 nm by sputtering. Then the resultant was ultrasonic-cleaned in acetone to remove the resist and the Al film deposited thereon, thus forming the upper electrode 32. FIG. 15 is the cross-sectional view of the device produced in this way.

The resistance of the device produced as described above was measured by the dc four-terminal method and the magnetoresistance ratio thereof was 46%.

Example 2

The device was produced in the same manner as in Example 1 except that the second magnetic layer and the third magnetic layer were films of Co 0.5 nm thick. The resistance of this device was measured by the dc four-terminal method, and the magnetoresistance ratio thereof was 27%.

Example 3

Figure 20:
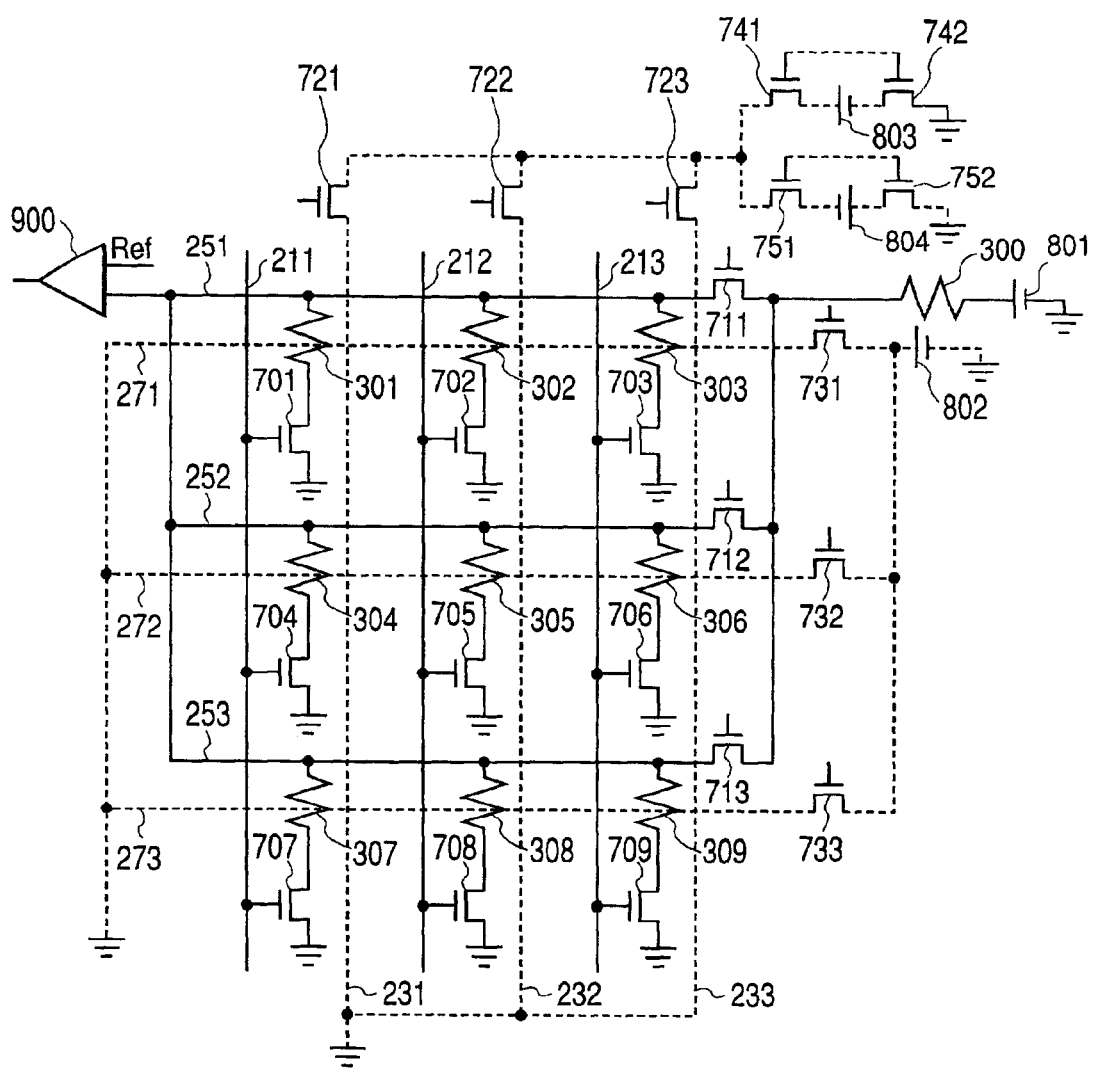
FIG. 20 is an equivalent circuit diagram for explaining a configuration of the MRAM in Example 3.
Figure 21:
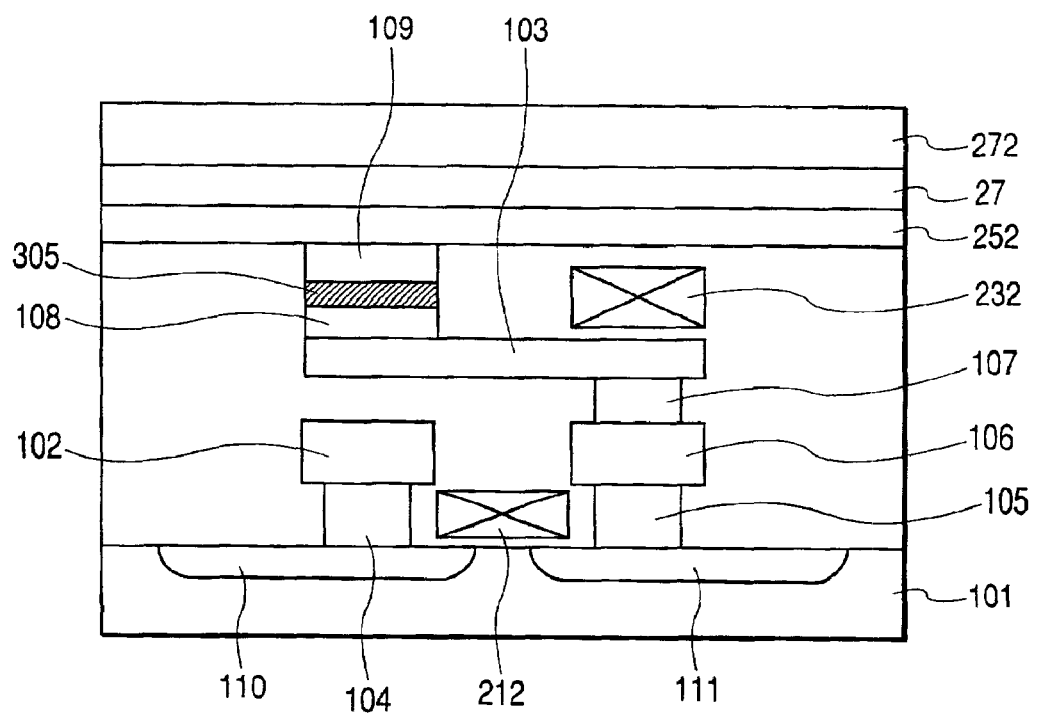
FIG. 21 is a cross-sectional view schematically showing a portion around one memory device in Example 3.

The present example illustrates an example of the MRAM in which the magnetoresistive elements are arrayed in a matrix of three rows and three columns. For the memory devices, a $Gd_{21}Fe_{79}$ alloy film was deposited as the first magnetic layer 21 in the thickness of 50 nm, a $Co_{30}Fe_{70}$ alloy film as the second magnetic layer 22 in the thickness of 1 nm, and an $Al_2O_3$ film as the nonmagnetic layer 23 in the thickness of 2.2 nm. Then inverse sputtering was carried out in oxygen gas to oxidize the $Al_2O_3$ film by plasma oxidation. Further deposited thereon in order were a $Co_{30}Fe_{70}$ alloy film as the third magnetic layer 24 in the thickness of 1 nm, a $Tb_{20}Fe_{80}$ alloy film as the fourth magnetic layer 25 in the thickness of 30 nm, and a Pt film as the protective layer 26 in the thickness of 2 nm. Numerals 301, 302, 303, 304, 305, 306, 307, 308, and 309 designate the magnetoresistive elements arrayed in the matrix. FIG. 20 is an equivalent circuit diagram showing this electric circuitry. Solid lines represent a circuit for detecting change in resistance of the magnetoresistive film, and dashed lines a circuit for generating the magnetic field applied to the magnetoresistive elements. FIG. 21 is a cross-sectional view schematically showing a portion around magnetoresistive element 305. Numeral 101 designates a P type Si substrate, 232 a write line for use in applying magnetic field perpendicular to a surface of the magnetoresistance effect film, 212 a gate electrode, 110 a source region, 111 a drain region, 252 a bit line, 102 a ground line, 103 a local wiring, 104 to 109 contact plugs, 27 an insulating film, and 272 a write line for applying a magnetic field in a direction toward an inside of the magnetoresistance effect film.

Described below is a method of selectively reversing magnetization of a device, for recording or reproduction of information in the MRAM as described above. An electric current supplied from power supply 802 is one for generating a magnetic field applied in a direction inclined from the easy axis of magnetization, preferably in a longitudinal direction, to the magnetoresistive film. An electric current supplied from power supply 803 and power supply 804 is one for generating a magnetic field applied in the direction of easy magnetization, i.e., in the perpendicular direction to the magnetoresistive elements. For example, let us explain a case of selectively reversing the magnetization of the magnetoresistive film 305. A transistor 732 is switched on in order to apply the magnetic field in the longitudinal direction to the memory device 305. As seen from the figure, at the same time as it, the magnetic field is also applied in the same intensity and in the longitudinal direction to the memory device 304 and memory device 306. Further, a transistor 722 is switched on to apply the magnetic field in the perpendicular direction to the memory device 305. At this time, the magnetic field is also applied in the same intensity and in the perpendicular direction to the memory devices 302 and 308. It is, however, necessary to change the direction of the magnetic field applied in the perpendicular direction, depending upon to which direction the magnetization is to be directed in the magnetic films. This is achieved by changing the polarity of the voltage applied to the conductor line. For example, for applying the magnetic field in the perpendicularly downward direction, transistor 741 and transistor 742 are switched on; for applying the magnetic field in the perpendicularly upward direction, transistor 751 and transistor 752 are switched on. Through the above operation the magnetic fields are applied both in the longitudinal direction and in the perpendicular direction to only the magnetoresistive film 305. On this occasion, it is feasible to apply the magnetic field in an arbitrary direction and in an arbitrary intensity, by properly changing the electric current in the conductor line for applying the magnetic field in the perpendicular direction and the current value in the conductor line for applying the magnetic field in the longitudinal direction. For example, a conceivable way is such that the magnetic field is first applied in the longitudinal direction, the intensity of the magnetic field in the perpendicular direction is gradually increased so as to change the direction of the resultant magnetic field from the longitudinal direction, i.e., the direction of π/2 relative to the direction of easy magnetization of the perpendicularly magnetized films, gradually to the perpendicular direction, the application of the magnetic field in the longitudinal direction is finally stopped, thereby applying the magnetic field only in the perpendicular direction.

As described above, smooth reversal of magnetization is achieved by gradually changing the direction of the resultant magnetic field, so as to enable decrease in the magnetization reversal field, thereby enabling decrease in the electric currents flowing in the wiring lines and power saving of the magnetic memory.

For the reversal of magnetization in recording or reproduction of information in the MRAM or the like, however, the peripheral circuitry could become complex in order to apply the magnetic field with variation in the intensity and direction thereof as occasion arises. In this case, therefore, the intensity and direction of the magnetic field do not have to be changed daringly and the memory can be configured in such setting of physical property values etc. that a specific magnetoresistive element is selected by simultaneously applying the magnetic fields in the direction of easy magnetization and in the direction inclined from the easy axis of magnetization.

When the magnetic films formed above and below the nonmagnetic film in the magnetoresistive elements are those wherein the direction of magnetization is fixed in one magnetic film and the magnetization in the other film can be reversed by the magnetic field applied, the magnetization is reversed only in the memory device 305 by the above magnetic field applying method. When the devices are of the magnetoresistive film of the coercive force difference type in which the readout layer with the relatively small coercive force can undergo reversal of magnetization by only the magnetic field applied in the perpendicular direction, the above operation also reverses the magnetization in the readout layer in the memory devices 302 and 308, in addition to the memory device 305. However, magnetization in the recording layer is reversed only in the memory device 305. Namely, recording is effected only in the memory device 305, so as to be able to select a specific magnetoresistive element.

In the magnetoresistive film of this type, the magnetic field applied in the readout operation can be one applied only in the perpendicular direction. Further, in the case of the magnetoresistive film wherein the reversal of magnetization in the readout layer requires application of the magnetic fields both in the longitudinal direction and in the perpendicular direction, the voltage of power supply 803, and power supply 804 or the voltage of power supply 802 can be set lower than the voltage during recording to decrease the intensity of the magnetic field generated so that magnetization is reversed only in the memory device 305 but magnetization is not reversed in the recording layer during the readout operation.

The readout operation will be described below. For example, for reading the information recorded in the magnetoresistive film 305, transistor 712 and transistor 705 are switched on. This results in establishing a circuit in which the power supply 801, fixed resistor 300, and magnetoresistive film 305 are connected in series. Accordingly, the supply voltage is divided into the respective resistors at a ratio of the resistance of the fixed resistor 300 to the resistance of the magnetoresistive film 305. Since the supply voltage is fixed, the voltage on the magnetoresistive film varies according to change in the resistance of the magnetoresistive film. The voltage values are read by sense amplifier 900.

Either of the above-described relative detection method and absolute detection method can be applied to the MRAM of the present embodiment, of course. In either of the readout methods, however, the magnetoresistance ratio is preferably as large as possible and, particularly, in the case of relative detection, the magnetoresistance ratio is preferably not less than 10%, because the magnetoresistance ratio of the magnetoresistive element to be read itself is associated.

Comparative Examples

Comparative Example 1

The device was produced in the same manner as in Example 1 except that the second magnetic layer and the third magnetic layer were films of Fe 1.5 nm thick. The resistance of this device was measured by the dc four-terminal method, and the magnetoresistance ratio thereof was 9%.

Comparative Example 2

The interior of the chamber was evacuated to a vacuum of not more than $1 \times 10^{-5}$ Pa and thereafter an $Al_{50}Cu_{50}$ alloy film as the lower electrode 31 was deposited in the thickness of 25 nm on a silicon wafer by magnetron DC sputtering. A $Gd_{21}Fe_{79}$ alloy film was deposited as the first magnetic layer 21 in the thickness of 50 nm and an $Al_2O_3$ film was deposited as the nonmagnetic layer 23 in the thickness of 2.2 nm. Then inverse sputtering was carried out in oxygen gas to oxidize the $Al_2O_3$ film by plasma oxidation. Further deposited thereon in order were a $Tb_{20}Fe_{80}$ alloy film as the fourth magnetic layer 25 in the thickness of 30 nm and a Pt film as the protective layer 26 in the thickness of 2 nm. The second magnetic layer 22 and the third magnetic layer 24 were not formed.

The magnetoresistive film obtained as described above was coated with a resist in the thickness of about 1 $\mu$m by the spinner, and a square resist pattern of 50 $\mu$m×50 $\mu$m was formed by the aligner. After that, the film was removed to the surface of the $Al_{50}Cu_{50}$ film by the milling machine and, subsequent thereto, an $Al_2O_3$ film was deposited as the insulating films 50 in the thickness of 90 nm. Then the resultant was ultrasonic-cleaned in acetone to remove the resist and the $Al_2O_3$ film deposited thereon. Two contact holes were bored in the $Al_2O_3$ film around the device obtained in this way, with the focused ion beam, and a patterned resist was again formed thereon by the aligner. An Al film was then deposited thereon in the thickness of 50 nm by sputtering. Then the resultant was ultrasonic-cleaned in acetone to remove the resist and the Al film deposited thereon, thereby forming the upper electrode 32.

The resistance of the device produced as described above was measured by the dc four-terminal method and the magnetoresistance ratio thereof was 3%.

Comparative Example 3

The device was produced in the same manner as in Example 1 except that the second magnetic layer and the third magnetic layer were $Co_{30}Fe_{70}$ alloy films 3 nm thick. The resistance of this device was measured by the dc four-terminal method and the magnetoresistance ratio thereof was 2%.

What is claimed is:

1. A magnetoresistive film in which at least a first magnetic layer, a second magnetic layer, a nonmagnetic layer, a third magnetic layer, and a fourth magnetic layer are stacked in the order named, wherein at least said first magnetic layer comprises Gd and said fourth magnetic layer comprises at least one of Tb or Dy, wherein each of said first magnetic layer and fourth magnetic layer has an easy axis of magnetization along a perpendicular direction to a film plane, and the second magnetic layer and the third magnetic layer have a greater spin polarization than the first magnetic layer and the fourth magnetic layer, and wherein said second and third magnetic layers are magnetic layers comprising at least Co and Co contents thereof are not less than 20 at. % nor more than 90 at. %.

2. The magnetoresistive film according to claim 1, wherein the Co contents of said second and third magnetic layers are not less than 30 at. % nor more than 50 at. %.

3. The magnetoresistive film according to claim 1, wherein said first magnetic layer and second magnetic layer are exchange-coupled with each other and said third magnetic layer and said fourth magnetic layer are exchange-coupled with each other, and wherein magnetization of the second magnetic layer and magnetization of the third magnetic layer are oriented in the perpendicular direction to the film plane by exchange coupling force from the first magnetic layer and from the fourth magnetic layer.

4. The magnetoresistive film according to claim 1, wherein thicknesses of said second magnetic layer and third magnetic layer are not less than 0.2 nm.

5. The magnetoresistive film according to claim 4, wherein the thicknesses of said second magnetic layer and third magnetic layer are not less than 0.5 nm nor more than 1.5 nm.

6. The magnetoresistive film according to claim 1, wherein said first magnetic layer and said fourth magnetic layer are alloy films of rare earth metal and transition metal.

7. The magnetoresistive film according to claim 1, wherein said nonmagnetic layer is comprised of an insulating film.

8. The magnetoresistive film according to claim 7, wherein said nonmagnetic layer is comprised of an oxide.

9. The magnetoresistive film according to claim 1, wherein said second and third magnetic layers comprise Fe.

10. A MRAM comprising a plurality of magnetoresistive films on a substrate, each of said magnetoresistive films in which at least a first magnetic layer, a second magnetic layer, a nonmagnetic layer, a third magnetic layer, and a fourth magnetic layer are stacked in the order named, wherein at least said first magnetic layer comprises Gd and said fourth magnetic layer comprises at least one of Tb or Dy, wherein each of said first magnetic layer and fourth magnetic layer has an easy axis of magnetization along a perpendicular direction to a film plane, and the second magnetic layer and the third magnetic layer have a greater spin polarization than the first magnetic layer and the fourth magnetic layer, and wherein said second and third magnetic layers are magnetic layers comprising at least Co and Co contents thereof are not less than 20 at. % nor more than 90 at.%.

11. A magnetoresistive element in which at least a first magnetic layer, a second magnetic layer, a nonmagnetic layer, a third magnetic layer, and a fourth magnetic layer are stacked in the order named, wherein each of said first magnetic layer and fourth magnetic layer has an easy axis of magnetization along a perpendicular direction to a film plane, and the second magnetic layer and the third magnetic layer have a greater spin polarization than the first magnetic layer and the fourth magnetic layer, wherein said first magnetic layer and second magnetic layer are exchange-coupled with each other and said third magnetic layer and said fourth magnetic layer are exchange-coupled with each other, and wherein said second and third magnetic layers are magnetic layers comprising at least Co and the Co contents thereof are not less than 20 at. % nor more than 90 at. %.

* * * * *